(12) United States Patent  
Adamec

(10) Patent No.: US 6,825,476 B2
(45) Date of Patent: Nov. 30, 2004

(54) COLUMN FOR A CHARGED PARTICLE BEAM DEVICE

(75) Inventor: Pavel Adamec, Heimstetten (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 120 days.

(21) Appl. No.: 10/182,226
(22) PCT Filed: Jan. 24, 2001
(86) PCT No.: PCT/EP01/00744  
§ 371 (c)(1), (2), (4) Date: Sep. 26, 2002
(87) PCT Pub. No.: WO01/54162  
PCT Pub. Date: Jul. 26, 2001

(65) Prior Publication Data  
US 2003/0075686 A1 Apr. 24, 2003

(30) Foreign Application Priority Data  
Jan. 24, 2000 (EP) .......................... 00101373

(51) Int. Cl.⁷ ............................................ H01J 37/317
(52) U.S. Cl. ............. 250/398; 250/396 R; 250/396 ML
(58) Field of Search ..................... 250/396 R, 396 ML, 250/310, 311, 306, 398

(56) References Cited

U.S. PATENT DOCUMENTS

| 4,725,736 A | * | 2/1988 | Crewe ..................... 250/396 R |
| 4,779,046 A | * | 10/1988 | Rouberoi et al. .......... 324/751 |
| 5,276,331 A | | 1/1994 | Oae et al. |
| 5,393,985 A | | 2/1995 | Yamakage et al. |
| 6,452,175 B1 | * | 9/2002 | Adamec ..................... 250/310 |
| 6,614,026 B1 | * | 9/2003 | Adamec ..................... 250/398 |

OTHER PUBLICATIONS

Patent Abstracts of Japan, vol. 1999, No. 11, Sep. 30, 1999 (JP 11 162384 A).

* cited by examiner

Primary Examiner—Keit T. Nguyen  
(74) Attorney, Agent, or Firm—Sughrue Mion, PLLC

(57) ABSTRACT

An improved column for a charged particle beam device is constituted by, among other things, deflectors for scanning the beam over the specimen, for aligning the beam with regard to the objective and for compensating aberrations caused by the objective. Thereby, the total number of electrode arrangements and/or coil arrangements that are used for the deflectors and that are independently controllable, is 8 or less.

24 Claims, 7 Drawing Sheets

COLUMN FOR A CHARGED PARTICLE BEAM DEVICE

FIELD OF THE INVENTION

The invention relates to an apparatus for the examination of specimen with a beam of charged particles. In particular, this invention relates to a miniaturized column for a charged particle beam device. Furthermore, this invention relates to a deflector for a charged particle beam device.

BACKGROUND OF THE INVENTION

Charged particle beam devices, such as scanning, transmission or micro-probe apparatuses to quote only a few, are powerful instruments which permit the observation, characterization and modification of heterogeneous organic and inorganic materials and their surfaces. In these instruments, the area to be examined (modified) is irradiated with a charged particle beam, which may be static or swept in a raster across the surface of the specimen. Depending on the specific application, the charged particle beam is more or less focused and the kinetic energy of the particles can vary considerably.

The types of signals produced when the charged particles impinge on a specimen surface include e.g. secondary electrons, backscattered electrons, Auger electrons, characteristic x-rays, and photons of various energies. These signals are obtained from specific emission volumes within the sample and can be used to examine many characteristics of the sample such as composition, surface topography, crystallography, etc.

Lately, attempts have been made to miniaturize charged particle beam devices. Several of these devices could then be grouped together to simultaneously examine or modify larger areas of the specimen or they could be installed in process lines with tight space restrictions. Furthermore, since spherical and chromatic aberrations of particle beam devices scale proportional to their geometrical dimensions, as long as the potential remains constant, miniaturized devices would be able to deliver higher spatial resolution and high beam current in a given spot size.

In general, most of the present charged particle devices are between 0,5 and 1,2 meters high with an average diameter of about 15 cm–40 cm. Distinct from that, developers are aiming at producing beam devices which are smaller than 10 cm with an average diameter of about 4 cm. However, since modem charged particle beam apparatuses are complex technical instruments with sophisticated vacuum systems, alignment mechanism and electronic control units, their geometrical dimensions can not simply be shrinked proportionally, even so this is attempted wherever possible.

For forming of the particle beams in the particle beam columns electromagnetic lenses and electromagnetic multipoles are used. Lenses are axially symmetric electromagnetic fields used for focusing of the beam. Electromagnetic multipoles generate static deflecting fields (deflectors) for correction of the beam path through the electromagnetic lenses and for positioning the beam at the specimen, dynamic deflecting fields used for scanning the beam over the specimen and quadrupole fields (stigmators) used for compensation of the aberrations arising from the deviations of the lenses from the axial symmetry. Each particle beam instrument contains usually at least one multipole for alignment, one multipole for astigmatism correction, one multipole for beam shift at the specimen and one multipole for beam scanning at the specimen. Each multipole usually consists of eight electrodes or coils. This can result in large amount, for example 30 to 40, of independent voltages and currents that have to be supplied to the particle beam column.

In a single standard commercial column the number of the control signals required to operate the device does not present a limiting factor. In miniaturised columns and column arrays, however, the large number of the voltages and currents that have to be supplied to each column presents a major problem. Especially, the complexity of the electrical connections required to control every column in a column array increases the cost of an column array significantly. Furthermore, the complexity of the circuits required to control and to drive the large number of the voltages and currents also leads an significant increase of the cost of a column array.

SUMMARY OF THE INVENTION

The present invention provides an improved column for a charged particle beam device, especially for miniaturized charged particle beam device. Furthermore, the present invention provides an improved deflector for a charged particle beam device. According to one aspect of the present invention, there is provided a column for a charged particle beam device as specified in independent claim 1. According to a further aspect of the present invention there is provided a deflector for a charged particle beam device as specified in independent claims 17 and 19. Further advantageous, features, aspects and details of the invention are evident from the dependent claims, the description and the accompanying drawings. The claims are intended to be understood as a first non-limiting approach of defining the invention in general terms.

The present invention provides an improved column for a charged particle beam device. The column comprises deflectors for scanning the beam over the specimen, for aligning the beam with regard to the objective and for compensating aberrations caused by the objective. Thereby, the total number of electrode arrangements and/or coil arrangements that are used for the deflectors and that are independently controllable, is 8 or less. This results in a reduction of 50% in the number of signals, that have to be supplied to column in order to control the direction of the beam, compared to the best column known to the inventor. Accordingly, the complexity of the wiring needed to supply these signals the column is reduced considerably. Furthermore, the complexity of the driving circuits is also reduced.

According to a further aspect of the present invention, a deflector for a charged particle beam device is provided. The deflector, according to one embodiment, comprises four electrode arrangements wherein each electrode arrangement consists of three single electrodes, each electrode having the shape of a ring segment, and wherein the four electrode arrangements are positioned along a ring in a manner that between each pair of electrodes from one electrode arrangement an electrode from another electrode arrangement is located. The deflector, according to a further embodiment, comprises four coils wherein two coils are positioned along a first ring and two coils are positioned along a second ring, which is concentric with the first ring and has a larger diameter than the first ring, in a manner that when viewed from the center of the rings every coil positioned on the first ring overlaps with the two coils positioned on the second ring. These improved deflectors have the advantage that they provide a high degree of homogeneity in the electric, magnetic deflecting field, respectively.

BRIEF DESCRIPTION OF THE DRAWINGS

Some of the above indicated and other more detailed aspects of the invention will be described in the following description and partially illustrated with reference to the figures. Therein:

Figure 1:
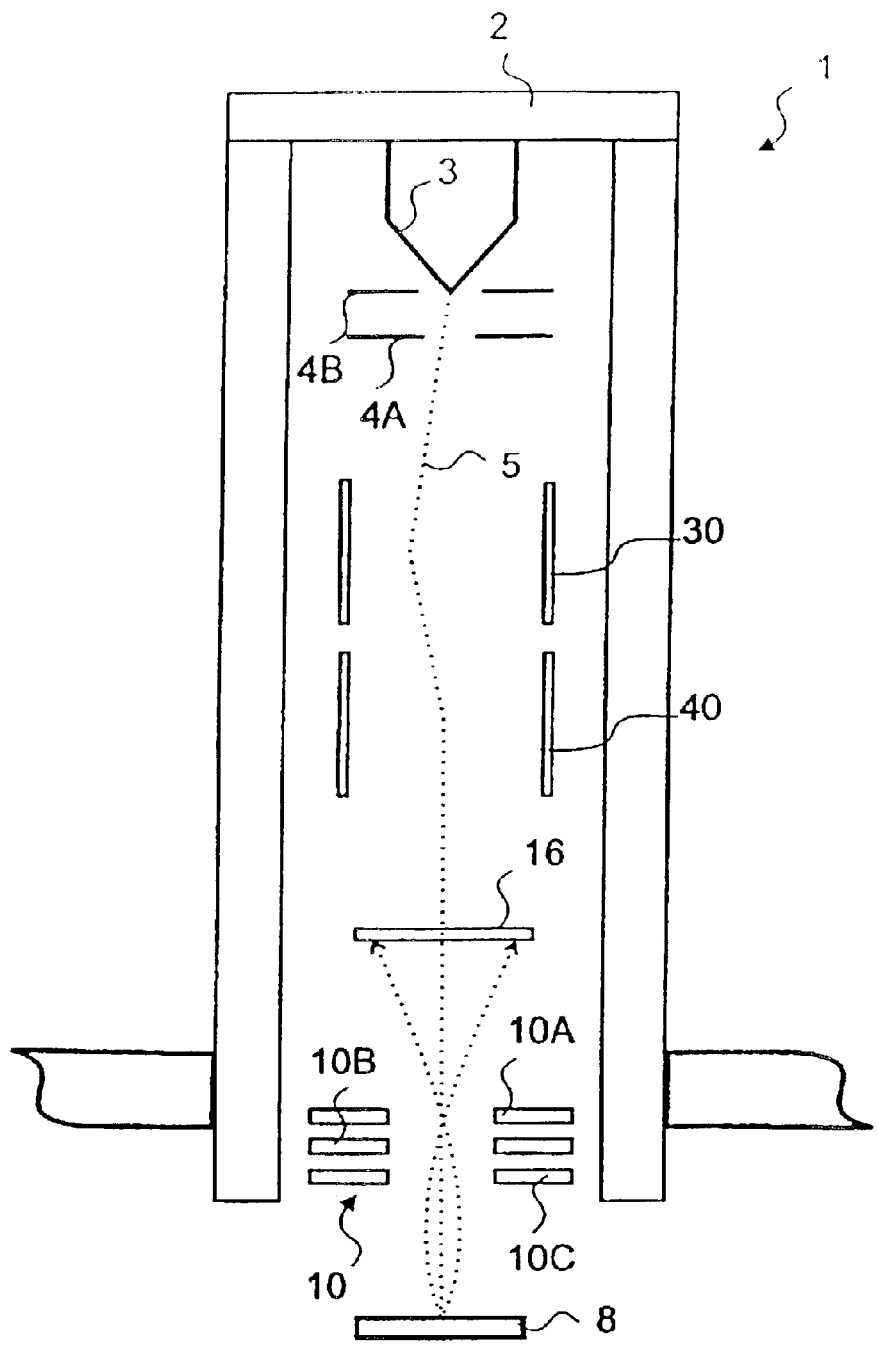
Figure 2A:
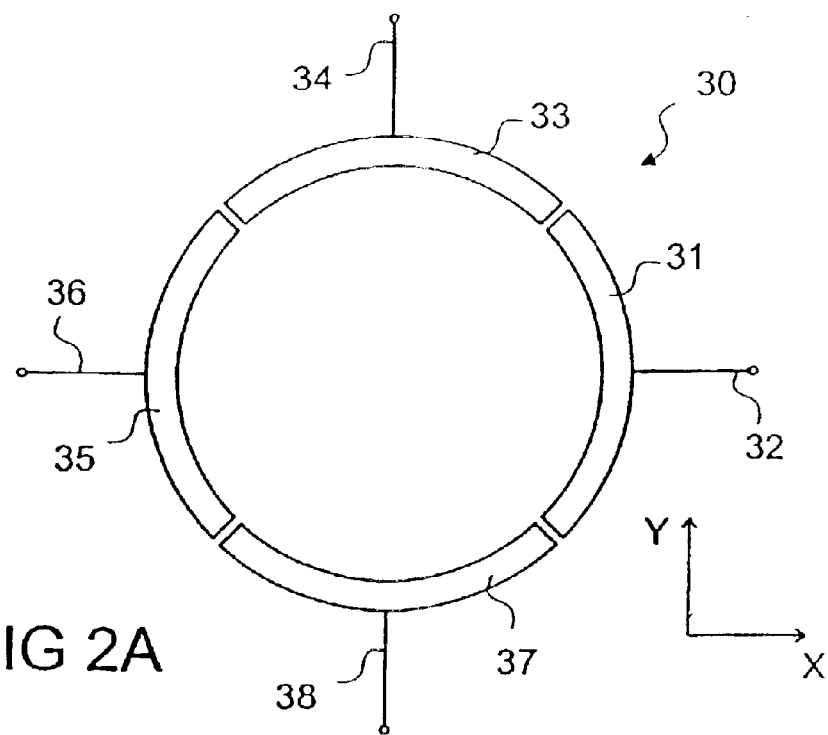
Figure 3A:
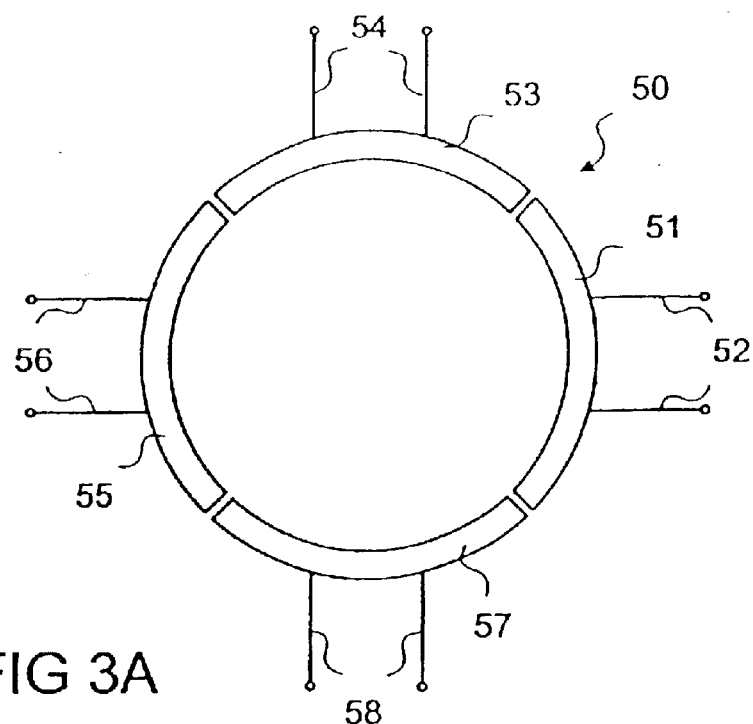
Figure 3B:
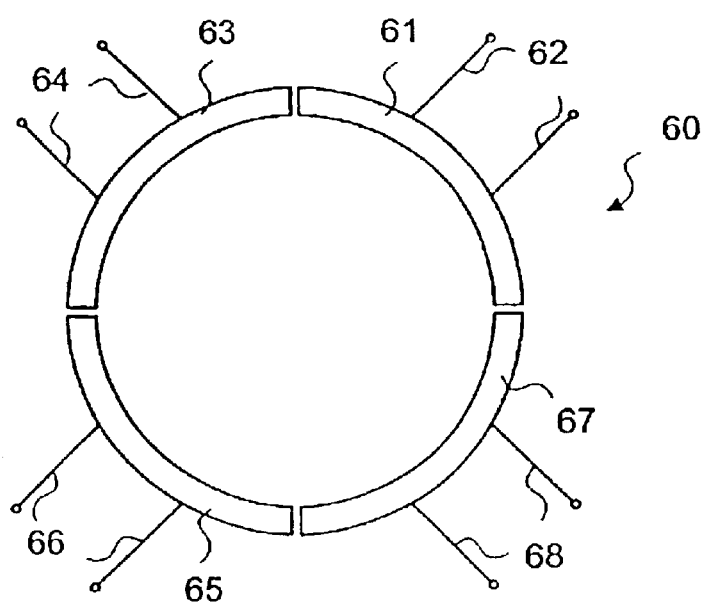
Figure 4:
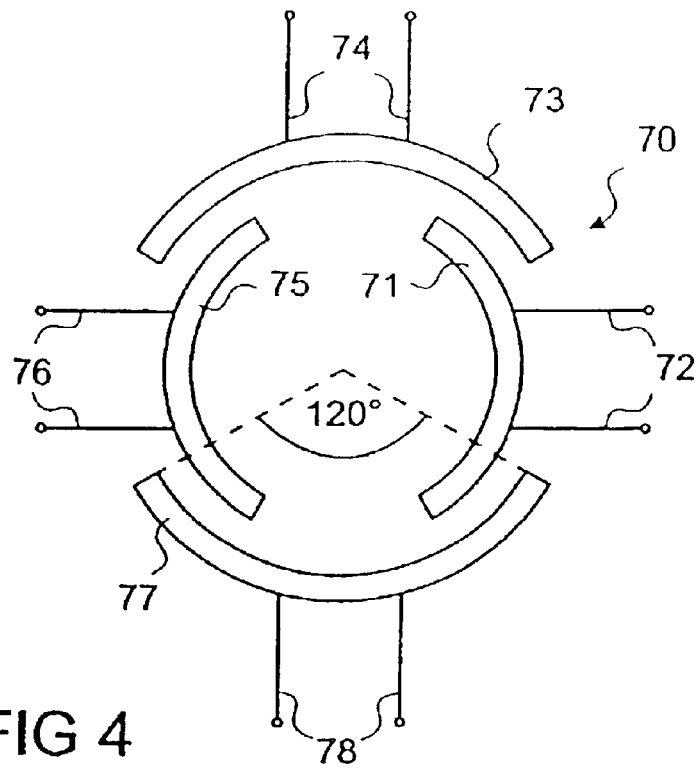
Figure 5:
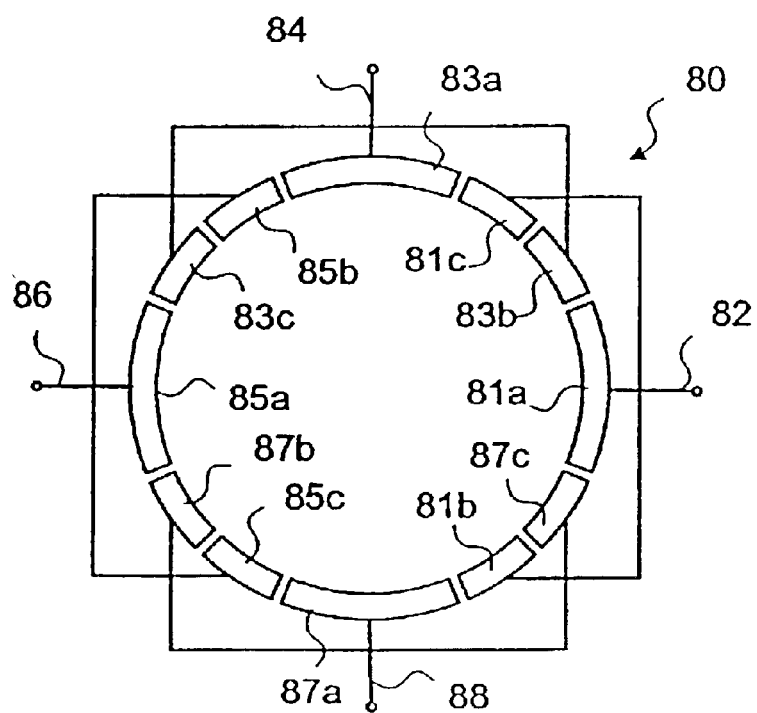
Figure 6:
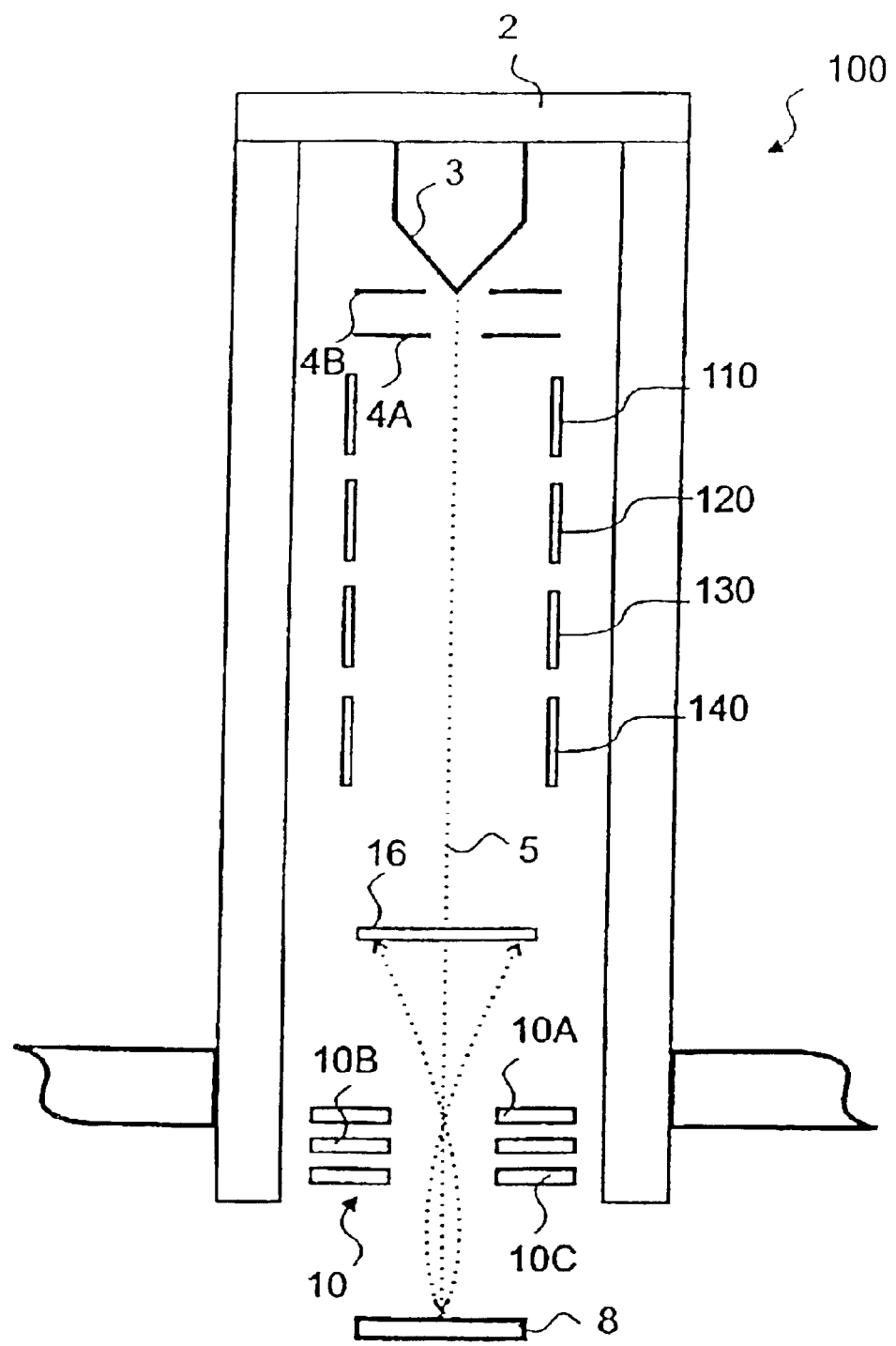
Figure 7A:
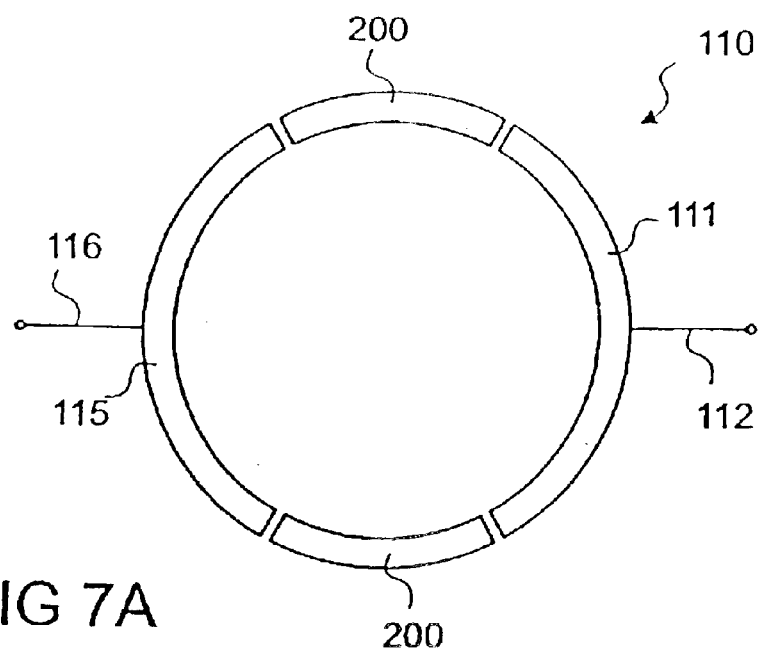
Figure 7B:
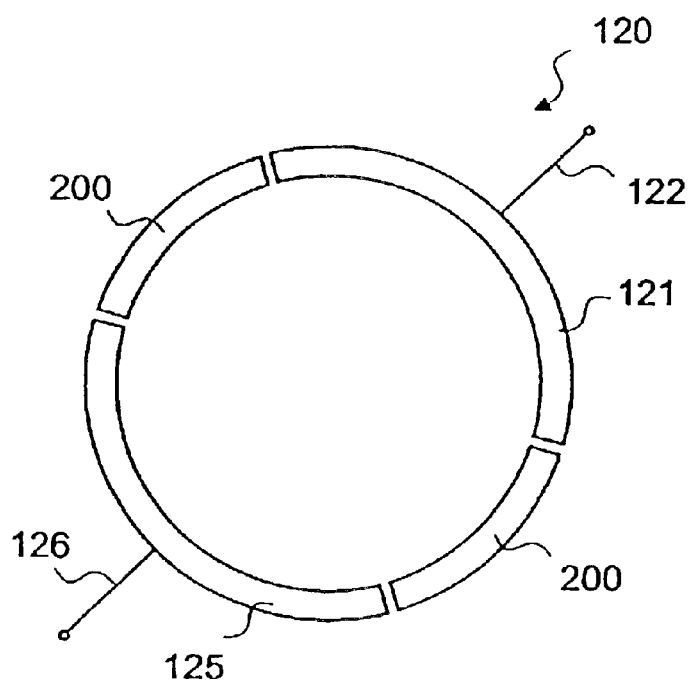
Figure 7C:
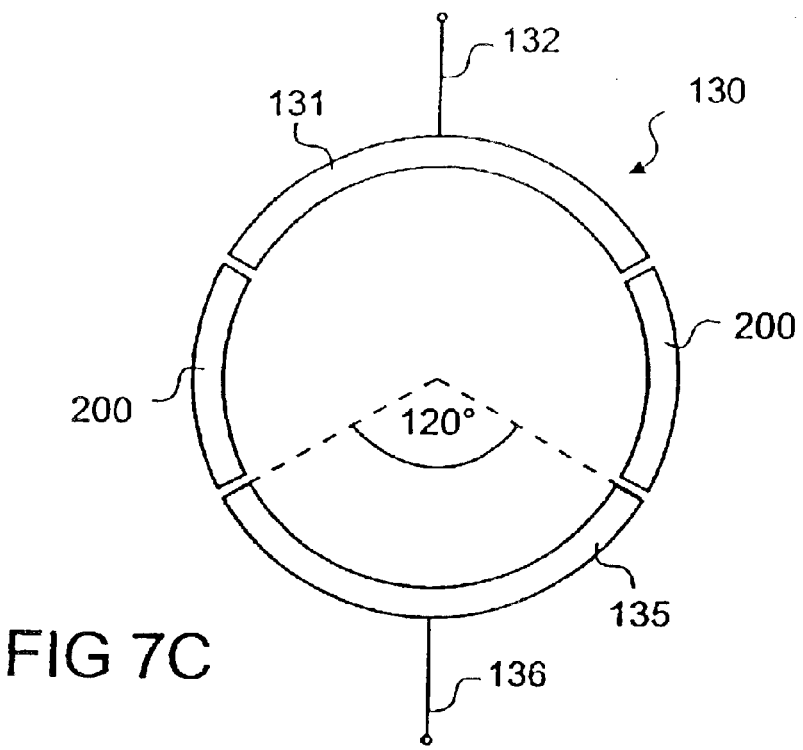
Figure 7D:
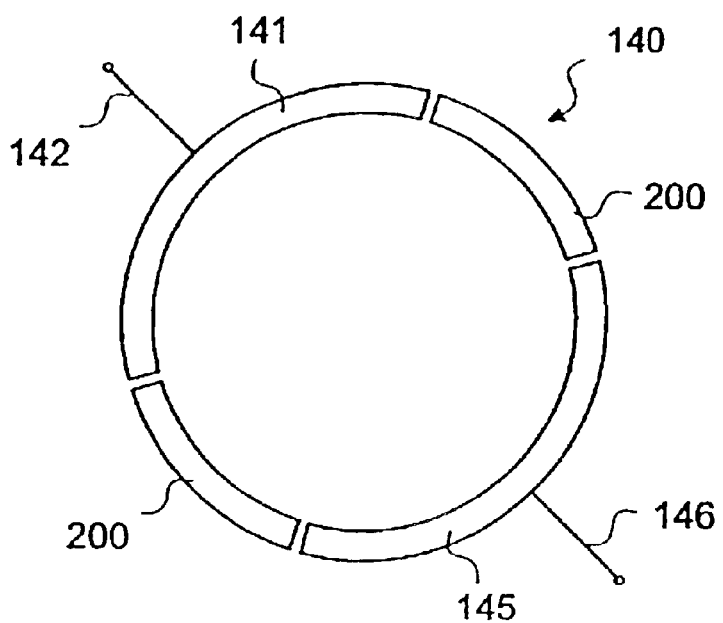

| | |
|---|---|
| FIG. 1 | shows schematically a column according to a first embodiment according to the present invention, |
| FIGS. 2A, B | show schematically the deflectors used in the embodiment shown in FIG. 1, |
| FIGS. 3A, B | show schematically further deflectors that can be used in the embodiment shown in FIG. 1, |
| FIG. 4 | shows schematically a deflector according to a further embodiment according to the present invention, |
| FIG. 5 | shows schematically a deflector according to a still further embodiment according to the present invention, |
| FIG. 6 | shows schematically a column according to a further embodiment according to the present invention, and |
| FIGS. 7A–D | show schematically the deflectors used in the embodiment shown in FIG. 6. |

DESCRIPTION OF THE PREFERRED EMBODIMENTS

An embodiment according to the invention is shown schematically in FIG. 1. The charged particle beam device 1 comprises a top cover plate 2 to which a charged particle source 3 is attached. In electron beam devices, electron sources such as Tungsten-Hairpin guns, lanthanum-Hexaboride Guns, Field emission guns etc. can be used. The invention, however, is not limited to electron sources; it can be used together with all kinds of charged particle sources. In the embodiment shown in FIG. 1 an extractor 4A and a suppressor 4B is arranged below particle source 3. The extractor 4A which is set on an accelerating potential accelerates the charged particles coming from the source. Contrary to that, the suppressor 4B which is arranged between the accelerator 4A and the source 3 is set on a suppression potential to limit the number of particles being pulled out of the source 3. This way the beam current is prevented from becoming to high.

Figure 2B:
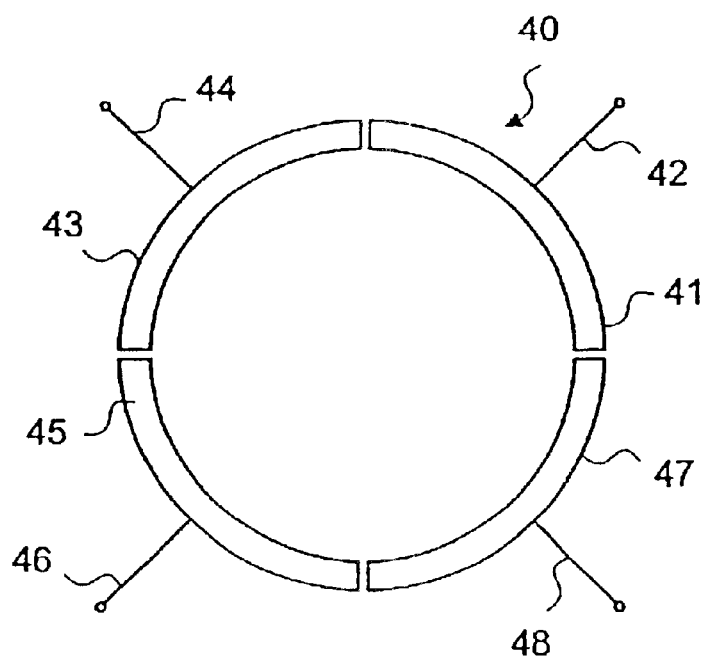

After the beam of charged particles 5 has been formed and left the source 3, the deflectors 30 and 40 are used to control and to refine the charged particle beam before it hits the specimen 8. The particular arrangement of these components is shown in FIGS. 2A and 2B. In order to shape the beam 5 one or more condenser lenses (not shown) can be used. The beam 5 then enters the electrostatic objective lens 10 which is used to focus the beam 5 onto the specimen 8. In the present example the electrostatic objective lens 10 comprises three electrodes 10A, 10B, and 10C each having the form of a flat ring.

When the particles of beam 10 strike the surface of specimen 8, they undergo a series of complex interactions with the nuclei and electrons of the atoms of the specimen. The interactions produce a variety of secondary products, such as electrons of different energy, X rays, heat, and light. Many of these secondary products are used to produce the images of the sample and to collect additional data from it. A secondary product of major importance to examination or the image formation of specimens are secondary electrons that escape from the specimen 8 at a variety of angles with relatively low energy (3 to 50 eV) The secondary and the back scattered electrons reach the detector 16 and are measured. By scanning the electron beam over the specimen and displaying/recording the output of the detector 16 an image of the surface of the specimen 8 is formed.

FIGS. 2A,B show schematically the deflectors 30 and 40 used in the column shown in FIG. 1. The deflectors 30 and 40 are electrostatic deflectors which influence the beam of charged particle by a static electric field. Each of the deflectors comprises 4 electrodes, electrodes 31, 33, 35, 37 and 41, 43, 45, 47, respectively, which are positioned along a ring centered around the beam of charged particles. In a cross-section normal to the beam of charged particles all the electrodes 31, 33, 35, 37 and 41, 43, 45, 47 exhibit the shape of a ring segment, as can be seen from FIGS. 2A, B. In order to influence the propagation of the charged particle beam, every electrode is independently controllable, in the sense that the potential of every electrode can be selected independently from the potentials present on all the other electrodes.

In order to provide a predetermined potential on a selected electrode, every electrode comprises a connection 32, 34, 36, 38 and 42, 44, 46, 48. The connections 32, 34, 36, 38 and 42, 44, 46, 48 are used to supply the corresponding voltages to the selected electrodes. During the operation of the column shown in FIG. 1 the deflectors 30 and 40 cooperate in order to scan the beam of charged particles over the specimen, to align the beam with regard to the objective lens axis and to compensate aberrations caused by the objective. In order to compensate aberrations (especially astigmatism) caused by the objective (stigmation), for example, a voltage $+V_1$ is supplied to the electrodes 31 and 35 of deflector 30 whereas the voltage $-V_1$ is supplied to the electrodes 33 and 37 of deflector 30. However, in general the field of a 4-pole is not sufficient to compensate astigmatism caused by the objective. Therefore, a voltage $+V_2$ is supplied to the electrodes 41 and 45 of deflector 40 whereas the voltage $-V_2$ is supplied to the electrodes 43 and 47 of deflector 40 . Due to the fact that the two deflectors 30 and 40 are rotated with regard to each other (in this example by 45° degrees), the astigmatism can be compensated in every chosen plane normal to the plane of the drawing. By varying $V_1$ and $V_2$ independently from each other every plane orientation can be selected.

In order to align the beam of charged particles with regard to the objective or to shift the beam of charged particles with regard to the objective, for example, a voltage $+U_x$ and a voltage $-U_x$ is supplied to the electrodes 35 and 31 of deflector 30, respectively. Furthermore, a voltage $-k_x U_x$ is supplied to the electrodes 43 and 45 and a voltage $+k_x U_x$ is supplied to the electrodes 41 and 47 of deflector 40, respectively. Thereby, $k_x$ is a constant depending on the angle of rotation between the two the deflectors 30 and 40 and the desired path of the charged particle beam in x-direction. By using this arrangement, the charged particle beam can be guided through the two deflectors as shown in FIG. 1A which corresponds to a situation where the beam exhibits an initial misalignment. Obviously, by supplying the voltages $+U_y$ to the electrodes 33, $-U_y$ to the electrodes 37, $-k_y U_y$ to the electrodes 41 and 43 and $+k_y U_y$ to the electrodes 45 and 47 the same can be achieved for the y-direction.

In order to scan the beam of charged particles over the specimen, the same voltage arrangement that has been used in order to align the beam can be used. Only the values of the voltages (e.g. $V_x$ and $V_y$) and the values of the constants (e.g. $c_x$ and $c_y$) are different. During the operation of the deflectors all these voltages ($V_1$, $V_2$, $U_x$, $U_y$, $V_x$ and $V_y$) are used simultaneously, so that, in general, every electrode may have a potential that is different from the potentials of all the other electrodes. Thereby, the signals controlling the scanning, alignment and stigmation are mixed already before the final amplifier (not shown) so that the electronic circuits are kept relatively simple and only the resulting voltage is supplied to each electrode. Accordingly, the two deflectors are controlled via only 8 connections (32, 34, 36, 38 and 42, 44, 46, 48).

In order to further reduce the number of necessary connections to the deflectors, two of the electrodes of each deflector 30 and 40, e.g. electrodes 35 and 37 of deflector 30 and electrodes 41 and 43 of deflector 40, may be kept on a fixed potential, e.g. ground potential. Accordingly, no signals controlling the potentials of the electrodes 35, 37, 41 and 43 have to be provided and the corresponding wiring can be omitted. In such an embodiment the number of electrodes that are independently controllable is reduced to 4.

The deflectors 30 and 40 shown in FIGS. 2A and B are electrostatic deflectors which influence the beam of charged particle by a static electric field. As an alternative magnetic deflectors 50 and 60 as shown in FIGS. 3A and B can also be used. The deflectors 50 and 60 comprises 4 coils, coils 51, 53, 55, 57 and 61, 63, 65, 67, respectively, which are positioned along a ring centered around the beam of charged particles. In a cross-section normal to the beam of charged particles all the coils 51, 53, 55, 57 and 61, 63, 65, 67 exhibit the shape of a ring segment, as can be seen from FIG. 3A, B. In order to influence the propagation of the charged particle beam, every coil is independently controllable, in the sense that the current through every coil can be selected independently from the currents flowing through the other coils.

In order to provide a predetermined current flowing through a selected coil, every coil comprises two connections (52, 54, 56, 58 and 62, 64, 66, 68) which are used to supply a corresponding current to the selected coil. When one replaces voltages by currents basically all what has been said with regard to electrostatic deflectors 30 and 40 remains true for the magnetic deflectors 50 and 60. Accordingly, deflectors 50 and 60 can also be controlled by only 8 independent signals, in order to scan the beam of charged particles over the specimen, to align the beam with regard to the objective and to compensate aberrations caused by the objective.

FIG. 4 shows schematically a deflector according to a further embodiment according to the present invention. The magnetic deflectors 50 and 60 as shown in FIGS. 3A and B exhibit a magnetic field that shows a high degree of homogeneity in the vicinity of the charged particle beam. However, in order to improve the homogeneity of the magnetic field, the magnetic deflector 70 as shown in FIG. 4 is provided. The deflector 70 comprises four coils 71, 73, 75, and 77. Thereby, two coils 71 and 75 are positioned along a first ring and two coils 73 and 77 are positioned along a second ring, which concentric with the first ring and has a larger diameter than the first ring. The four coils are positioned in a manner that when viewed from the center of the rings every coil 71 and 75, positioned on the first ring, overlaps with the two coils 73 and 77, positioned on the second ring. The coils 71, 73, 75, and 77 are designed so that the angle covered by a coil is about 120° degrees. The magnetic deflector 70 exhibits a magnetic field that shows a very high degree of homogeneity in the vicinity of the charged particle beam.

FIG. 5 shows schematically a deflector according to a still further embodiment according to the present invention. The electrostatic deflectors 30 and 40 as shown in FIGS. 2A and B exhibit an electrostatic field that shows a high degree of homogeneity in the vicinity of the charged particle beam. However, in order to improve the homogeneity of the electrostatic field, the electrostatic deflector 80 as shown in FIG. 5 is provided. The deflector 80 comprises four electrode arrangements 81, 83, 85, and 87. Thereby, each electrode arrangement 81, 83, 85, and 87 consists of three single electrodes (81a, 81b, 81c, 83a, 83b, 83c, 85a, 85b, 85c, 87a, 87b and 87c), each electrode (81a, 81b, 81c, 83a, 83b, 83c, 85a, 85b, 85c, 87a, 87b and 87c) having the shape of a ring segment. The four electrode arrangements 81, 83, 85, and 87 are positioned along a ring in a manner that between each pair of electrodes from one electrode arrangement an electrode from another electrode arrangement is located.

The electrodes of one electron arrangement, for example the electrodes 81a, 81b, and 81c of electrode arrangement 81, are always kept on the same potential. Accordingly, only one connection 82 is necessary to supply the corresponding voltage to the electrodes (81a, 81b, and 81c). As can be seen from FIG. 5, one of the three electrodes (for example 81a) of a electrode arrangement (for example 81) is at least twice the size of the other electrodes (81b and 81c) of the electrode arrangement. The electrostatic deflector 70 exhibits an electrostatic field that shows a very high degree of homogeneity in the vicinity of the charged particle beam.

A further embodiment according to the invention is shown schematically in FIG. 6. This column 100 is similar to that of FIG. 1, except for the following. The column contains four deflectors 110, 120, 130 and 140 which positioned along the path of the charged particle beam. The corresponding deflectors are shown in FIGS. 7A to 7D.

The deflectors 110, 120, 130 and 140 are electrostatic deflectors which influence the beam of charged particle by a static electric field. Each of the deflectors comprises only two active electrodes 111, 115, 121, 125, 131, 135, 141 and 145, respectively, which are positioned along a ring centered around the beam of charged particles. In a cross-section normal to the beam of charged particles all the active electrodes 111, 115, 121, 125, 131, 135, 141 and 145 exhibit the shape of a ring segment covering an angle of about 120°, as can be seen from FIGS. 7A to 7D. In addition to the active electrodes each of the deflectors 110, 120, 130 and 140 comprises two inactive electrodes 200 which are kept on fixed potential, e.g. the column potential. In order to influence the propagation of the charged particle beam, again every electrode is independently controllable, in the sense that the potential of every electrode can be selected independently from the potentials present on all the other electrodes.

In order to provide a predetermined potential on a selected electrode, every electrode comprises a connection 112, 116, 122, 126, 131, 136, 141 and 146, respectively. The connections 112, 116, 122, 126, 131, 136, 141 and 146 are used to supply the corresponding voltages to the selected electrodes. During the operation of the column shown in FIG. 6 the deflectors 110, 120, 130 and 140 cooperate in order to scan the beam of charged particles over the specimen, to align the beam with regard to the objective and to compensate aberrations caused by the objective. In order to compensate aberrations caused by the objective (stigmation), for example, a voltage $+V_1$ is supplied to the electrodes 111 and 115 of deflector 110 whereas the voltage $-V_1$ is supplied to the electrodes 131 and 135 of deflector 130. Furthermore, a voltage $+V_2$ is supplied to the electrodes 121 and 125 of deflector 120 whereas the voltage $-V_2$ is supplied to the electrodes 141 and 145 of deflector 140. Due to fact that the deflectors 110, 120, 130 and 140 are rotated with regard to each other (in this example by 45° degrees), the aberrations can be compensated in every chosen plane normal to the plane of the drawing.

In order to align the beam of charged particles with regard to the objective or to shift the beam of charged particles with regard to the objective, for example, a voltage $-U_x$ and a voltage $+U_x$ is supplied to the electrodes 111 and 115 of deflector 110, respectively. Furthermore, a voltage $-k1_x U_x$ is supplied to the electrodes 121 and 125 and a voltage $+k2_x U_x$ is supplied to the electrodes 141 and 145 of deflector 140, respectively. Thereby, $k1_x$ and $k2_x$ are constants depending on the angles of rotation between the deflectors 110, 120 and 140 and the desired path of the charged particle beam in x-direction. Obviously, by supplying the voltages $+U_y$ to the electrodes 131, $-U_y$ to the electrodes 135, $-k1_y U_y$ to the electrodes 121 and 125 and $-k2_y U_y$ to the electrodes 141 and 145 the same can be achieved for the y-direction.

In order to scan the beam of charged particles over the specimen, the same voltage arrangement that has been used in order to align the beam can be used. Only the values of the voltages (e.g. $V_x$ and $V_y$) and the values of the constants (e.g. $c1_x$, $c2_x$, $c1_y$ and $c2_y$) are different. During the operation of the deflectors all these voltages ($V_1$, $V_2$, $U_x$, $U_y$, $V_x$ and $V_y$) are used simultaneously, so that, in general, every electrode may have a potential that is different from the potentials of all the other electrodes. Again, the signals controlling the scanning, alignment and stigmation are mixed already before the final amplifier (not shown) so that the electronic circuits are kept relatively simple and only the resulting voltage is supplied to each electrode. Accordingly, the four deflectors are controlled via only 8 connections.

The deflectors 110, 120, 130 and 140 shown in FIGS. 7A to 7D are electrostatic deflectors which influence the beam of charged particle by a static electric field. As an alternative magnetic deflectors, each having two independently controllable coils can also be used.

What is claimed is:

1. A column for a charged particle beam device, which is used to examine or to modify a specimen, said column comprising:
   a) a particle source for providing a beam of charged particles,
   b) an objective for focussing the beam onto the specimen, and
   c) deflectors for scanning the beam over the specimen, for aligning the beam with regard to the objective and for compensating aberrations caused by the objective, wherein the total number of electrode arrangements and/or coil arrangements that are used for the deflectors and that are independently controllable, is 8 or less, and larger than 3;
   whereby the deflectors are rotated with regard to each other such that the aberrations can be compensated in every chosen plane parallel to the beam of charged particles.

2. The column according to claim 1, wherein the column comprises two deflectors each consisting of four electrode arrangements that are independently controllable.

3. The column according to claim 2, wherein the two deflectors have an identical structure and one deflector is rotated by 30° to 60° around the axis of the beam with respect to the other deflector.

4. The column according to claim 2, wherein each electrode arrangement consists of a single electrode having the shape of a ring segment.

5. The column according to claim 2, wherein each electrode arrangement consists of three single electrodes, each electrode having the shape of a ring segment.

6. The column according to claim 5, wherein four electrode arrangements are positioned along a ring in a manner that between each pair of electrodes from one electrode arrangement an electrode from another electrode arrangement is located.

7. The column according to claim 6, wherein one of the three electrodes of a electrode arrangement is at least twice the size of the other electrodes of the electrode arrangement.

8. The column according to claim 2, wherein the two deflectors have an identical structure and one deflector is rotated by about 45° around the axis of the beam with respect to the other deflector.

9. The column according to claim 1, wherein the column comprises two deflectors each consisting of four coil arrangements that are independently controllable.

10. The column according to claim 9, wherein each coil arrangement consists of a single coil having the shape of a ring segment.

11. The column according to claim 10, wherein two coils are positioned along a first ring and two coils are positioned along a second ring, being concentric with the first ring and having a larger diameter than the first ring, in a manner that when viewed from the center of the rings the two coils positioned on the first ring inscribe an arc that overlaps an arc inscribed by each of the two coils positioned on the second ring.

12. The column according to claim 11, wherein an angle covered by a coil is about 120°.

13. The column according to claim 1, wherein the column comprises four deflectors each consisting of two electrode arrangements that are independently controllable.

14. The column according to claim 13, wherein each electrode arrangement consists of a single electrode having the shape of a ring segment and an angle covered by an electrode is about 120° degrees.

15. The column according to claim 13, wherein the four deflectors have an identical structure and each deflector is rotated by 30° to 60° around the axis of the beam with respect to the adjacent deflectors.

16. The column according to claim 13, wherein the four deflectors have an identical structure and each deflector is rotated by about 45° around the axis of the beam with respect to the adjacent deflectors.

17. The column according to claim 1, wherein the column comprises four deflectors each consisting of two coil arrangements that are independently controllable.

18. The column according to claim 1, wherein the objective is an electrostatic objective lens.

19. A deflector for a charged particle beam device, which is used to examine or to modify a specimen, said deflector comprising four electrode arrangements wherein each electrode arrangement consists of three single electrodes, each electrode having the shape of a ring segment, and wherein the four electrode arrangements are positioned along a ring in a manner that between each pair of electrodes from one electrode arrangement an electrode from another electrode arrangement is located.

20. The deflector according to claim 19, wherein one of the three electrodes of an electrode arrangement is at least twice the size of the other electrodes of the electrode arrangement.

21. A deflector for a charged particle beam device, which is used to examine or to modify a specimen, said deflector comprising four coils wherein two coils are positioned along a first ring and two coils are positioned along a second ring, being concentric with the first ring and having a larger diameter than the first ring, in a manner that when viewed from the center of the rings the two coils positioned on the first ring inscribe an arc that overlaps an arc inscribed by each of the two coils positioned on the second ring.

22. The deflector according to claim 21, wherein an angle covered by a coil is about 120°.

23. A column for a charged particle beam device, which is used to examine or to modify a specimen, said column comprising:

a) a particle source for providing a beam of charged particles, b) an objective for focussing the beam onto the specimen, and c) two deflectors, each consisting of four electrode arrangements that are independently controllable, one deflector being rotated by 30° to 60° around the axis of the beam with respect to the other deflector, for scanning the beam over the specimen, for aligning the beam with regard to the objective and for compensating aberrations caused by the objective.

24. A column for a charged particle beam device, which is used to examine or to modify a specimen, said column comprising:

a) a particle source for providing a beam of charged particles, b) an objective for focussing the beam onto the specimen, and c) four deflectors, each consisting of two electrode arrangements that are independently controllable, each deflector being rotated by 30° to 60° around the axis of the beam with respect to the adjacent deflector, for scanning the beam over the specimen, for aligning the beam with regard to the objective and for compensating aberrations caused by the objective.

* * * * *